United States Patent [19]

Richart et al.

[11] Patent Number: 5,376,573

[45] Date of Patent: Dec. 27, 1994

[54] METHOD OF MAKING A FLASH EPROM DEVICE UTILIZING A SINGLE MASKING STEP FOR ETCHING AND IMPLANTING SOURCE REGIONS WITHIN THE EPROM CORE AND REDUNDANCY AREAS

[75] Inventors: Robert B. Richart; Shyam G. Garg; Fei Wang, all of Austin, Tex.

[73] Assignee: Advanced Micro Devices, Inc., Sunnyvale, Calif.

[21] Appl. No.: 165,445

[22] Filed: Dec. 10, 1993

[51] Int. Cl.$^5$ .......................................... H01L 21/265
[52] U.S. Cl. ...................................... 437/48; 437/43; 437/52; 437/923
[58] Field of Search ...................... 437/43, 48, 49, 50, 437/52, 923

[56] References Cited

U.S. PATENT DOCUMENTS

| | | |
|---|---|---|
| 4,999,812 | 3/1991 | Amin . |
| 5,070,032 | 12/1991 | Yuan et al. . |
| 5,101,250 | 3/1992 | Arima et al. . |
| 5,120,671 | 6/1992 | Tang et al. . |
| 5,279,982 | 1/1994 | Crotti ..................... 437/48 |

OTHER PUBLICATIONS

K. Robinson, "Endurance Brightens the Future of Flash—Flash Memory as a Viable Mask-Storage Alternative", *Electronic Component News*, (Nov., 1988), pp. 167–169.

S. Lai et al., "Comparison and Trends in Today's Dominant E$^2$ Technologies", *Int'l Electron Devices Meeting Tech. Digest*, pp. 580–583 (1986).

B. J. Woo et al., "A Novel Memory Cell Using Flash Array Contactless EPROM (FACE) Technology", *IEDM*, pp. 91–94 (1990).

O. Bellezza et al., "A New Self-Aligned Field Oxide Cell for Multimegabit EPROMs", *IEDM*, pp. 579–582 (1989).

Yosiaki S. Hisamune et al., "A 3.6 μm$^2$ Memory Cell Structure for 16MB EPROMs", pp. 583–586 (1989).

*Primary Examiner*—George Fourson
*Assistant Examiner*—Richard A. Booth
*Attorney, Agent, or Firm*—Kevin L. Daffer

[57] ABSTRACT

A flash EPROM device is provided for programmably storing digital data within a core array of electrically programmable transistors. A row or column within the array can be substituted for a spare or redundant row or column selectively connected to row or column decoder circuits by a redundancy select transistor. Self-aligned source regions within the array and redundancy select area are provided using a single mask for opening the self-aligned source regions and for implanting a light dosage of phosphorus directly into the underlying silicon substrate. Careful control and elimination of residue within the etched area via a subsequent wet etch helps ensure the implant edges are anisotropically controlled and isolated for subsequent lateral diffusion/-drive-in. Accordingly, the flash EPROM device of a plurality of transistors within the array and within the redundancy select area are process controlled and demonstrate a significant reduction in threshold skewing. A result being an array of electrically programmable transistors which read, write and erase at substantially the same threshold level for each transistor.

21 Claims, 3 Drawing Sheets

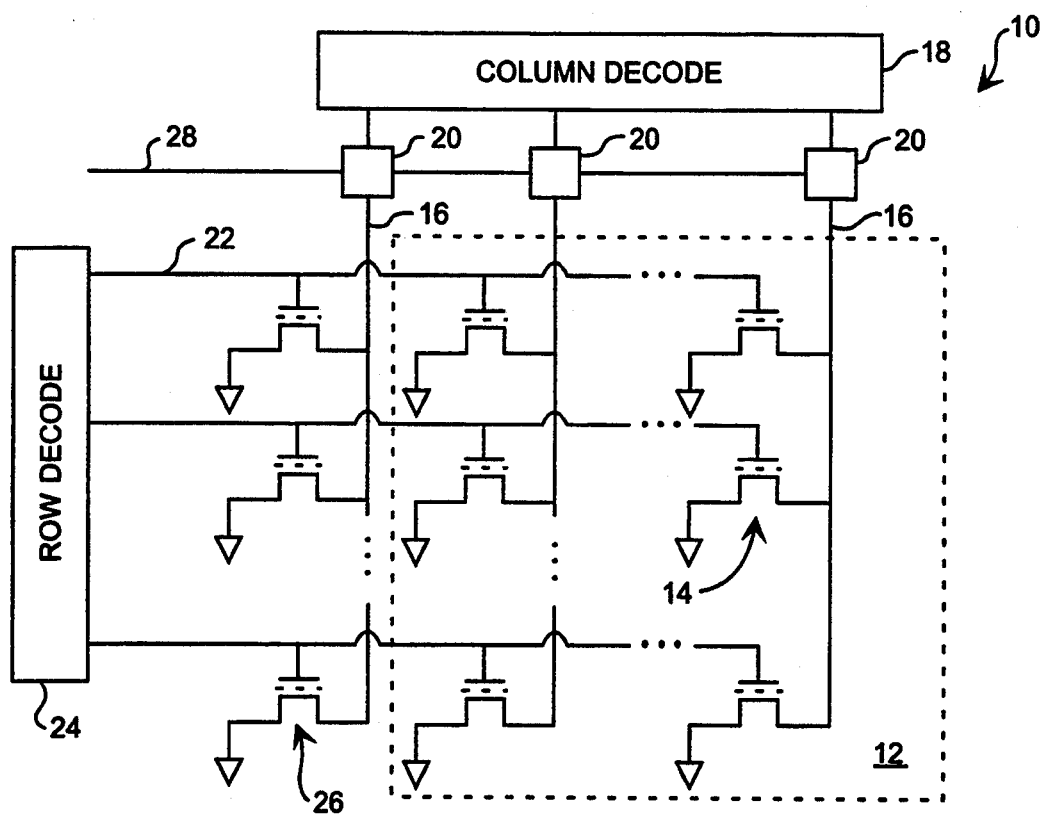
FIG. 1
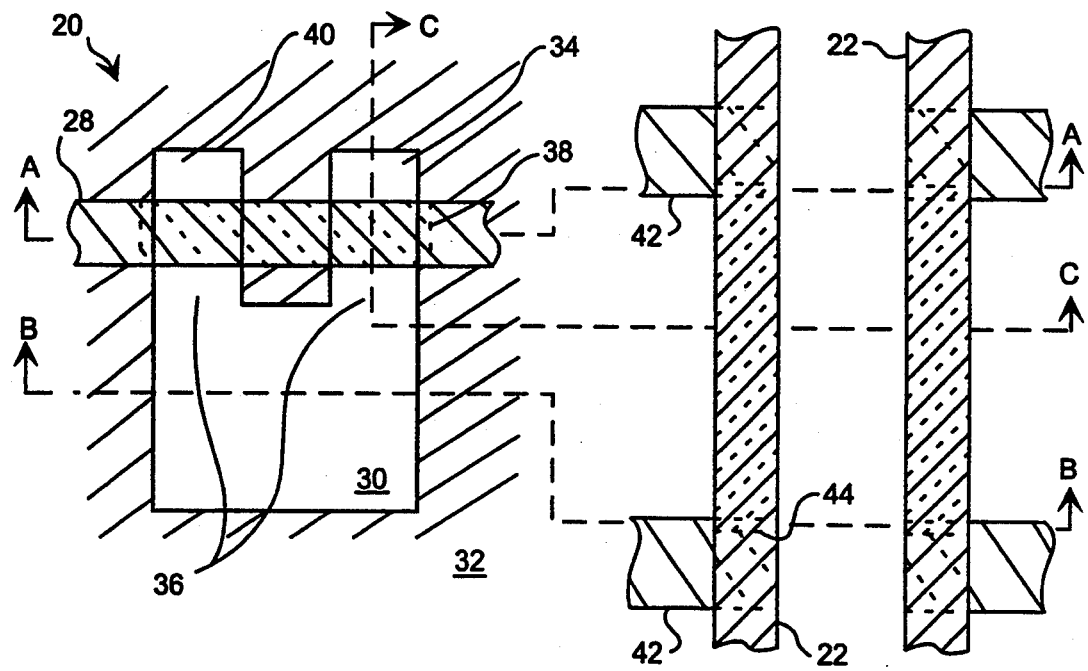
FIG. 2
FIG. 3

METHOD OF MAKING A FLASH EPROM DEVICE UTILIZING A SINGLE MASKING STEP FOR ETCHING AND IMPLANTING SOURCE REGIONS WITHIN THE EPROM CORE AND REDUNDANCY AREAS

BACKGROUND OF THE INVENTION

1. Field of the Invention

This invention relates to an integrated circuit and more particularly to a flash EPROM circuit with redundancy columns and method for manufacturing same.

2. Background of the Relevant Art

Programmable read only memories (PROM) and technologies associated therewith are well-known. PROMs can be formed in either bipolar or MOS technology. Bipolar PROMs generally are programmed using fusible-link techniques. Conversely, MOS devices can employ several reversible writing procedures in order to update their programmability. Accordingly, MOS PROMs can be formed using one of three currently available technologies: EPROM, EEPROM or flash EPROM.

EPROM devices have three characteristic features. EPROMs are non-volatile, can be bulk-erased via ultraviolet light, and generally require only a single transistor in each memory cell. As such, EPROMs can be re-programmed by passing the monolithic circuit through an ultraviolet light in order for the user to re-define a stored program therein. Pulling the EPROM device from the system and subjecting it to ultraviolet light is often cumbersome as witnessed by the advent of electrically erasable devices (referred to as "EEPROM"). EEPROMs generally require both a select transistor as well as the programmable storage transistor for each cell. The select transistor can be either separate from or part of the storage transistor. In either case, each cell of an EEPROM device is generally larger than a cell of an EPROM device. Accordingly, EEPROMs storage media is less dense than EPROM, and EEPROMs are classified as not having bulk-erase capability. Instead, EEPROMs can be byte-erased and can, in many instances, operate at conventional 5-volt levels.

In order to obtain some advantages found in both EPROMs and EEPROMs, flash EPROMs were developed. Flash EPROMs utilize a single transistor for each cell. Accordingly, flash EPROM cells do not have an independent controllable select gate in addition to a control gate for selecting and controlling digital memory stored in each cell. Thus, flash EPROMs appear similar to EPROM technology. Instead of being erased via ultraviolet light, flash EPROMs are electrically erasable—similar to EEPROM technology. Still further, flash EPROMs are bulk-erased instead of byte-erased.

Program and erase of a flash EPROM can be achieved using well known technologies such as: (i) floating gate tunnel oxide, (ii) textured poly, (iii) metal nitrite oxide silicon (MNOS), and (iv) EPROM-tunnel oxide (ETOX). Floating gate tunnel oxide is a popular program and erase technology and consists of a floating gate transistor with a thin oxide grown over the drain region. Programming (moving electrons into the floating gate) is achieved by biasing the control gate, while erasure (moving electrons out of the floating gate) is achieved by biasing the drain. Electron transfer is achieved through a thin tunnel oxide separating the drain from the floating gate. The tunnel oxide only exists in a small area overlying the drain and adjacent a thicker gate oxide. Textured poly generally utilizes three layers of polysilicon which overlap in order to form three transistors in series. Programming is achieved by electrons tunneling from a first polysilicon to a second polysilicon, whereas erase is achieved by electrons tunneling from the second polysilicon to a third polysilicon. Metal nitrite oxide silicon (MNOS) consists of a single transistor with a dielectric stack of silicon nitride on top of a thin layer of oxide, wherein the oxide is placed upon the silicon substrate. Unlike floating gate technology, charge of the MNOS device is stored in discrete traps in the bulk of the nitride. A comparison of floating gate tunnel oxide, textured poly, and MNOS technologies is described by S. Lai et al., "Comparison and Trends in Today's Dominant E$^2$ Technologies," *Int'l Electron Devices Meeting Tech. Digest*, (1986) pp. 580–583 (herein incorporated by reference).

More recent advances in flash EPROM technology has led to EPROM-tunnel oxide (ETOX) fabrication. Being less complicated than its predecessor, ETOX is more reliable to manufacture and can achieve high density and reproduceability. ETOX consists generally of a floating gate placed over a tunnel oxide, wherein the tunnel oxide is formed on the surface of the substrate and between source and drain regions. A control gate is placed above the floating gate and spaced therefrom by a dielectric. The source and drain regions are implanted generally perpendicular to the upper surface of the substrate, allowing the source and drain regions to slightly extend in a lateral direction beneath the floating gate outer edges. Electron transfer is achieved through the tunnel oxide region between the source and/or drain and the corresponding floating gate. A description of ETOX technology is provided by K. Robinson, "Endurance Brightens the Future of Flash —Flash Memory as a Viable Mask-Storage Alternative," *Electronic Component News* (November, 1988) pp. 167–169 (herein incorporated by reference).

Regardless of whether the flash EPROM device is formed according to floating gate tunnel oxide, textured poly, MNOS, or ETOX technology, there are numerous lithography steps needed to produce floating gate, control gate, tunneling area, etc., within a dense array of programmable transistors. In particular, it is important that as many transistors as possible be placed within a small array. Typically, this requires that word and bit lines be closely spaced to one another and that the plurality of programmable transistors which are coupled to the word and bit lines be formed with little tolerance to mis-alignment. In an effort to overcome misalignment and bird-beak encroachment problems often associated with field oxide mis-alignment with overlying polysilicon, as shown in U.S. Pat. No. 5,101,250 to Arima et al. (herein incorporated by reference), self-aligned source regions have gained in importance as a mechanism for overcoming such problems. Exemplary self-aligned source etch and implant technology is shown in U.S. Pat. No. 5,120,671 to Tang et al. (herein incorporated by reference).

Oftentimes, self-aligned source regions experience difficulties in etching and fully removing the field oxide overlying the source area. Plasma etching of the silicon dioxide is sometimes poorly selective to resist etching thereby causing resist residue (polymers) to deposit upon the substrate which is to receive source implant. The residue may hinder source implant, resulting in a decrease in the erase window area, a decrease in erase window overlap capacitance with the floating gate and, through voltage division, a higher erase field and faster erase. Voltage division refers to the series connection between the control gate, floating gate and silicon substrate. Furthermore, plasma etching of the silicon dioxide may also isotropically etch the field oxide in a lateral direction causing undercutting of the overlying polysilicon and thereby increasing the implant window area. An enlarged window area should be avoided if possible since it may cause additional lateral diffusion of the implanted impurities underneath the floating gate. Any additional lateral diffusion would add to the tunneling area, decreasing the erase field through voltage division, thereby forcing a slower erase of certain programmable transistors within the array. Uneven erase may cause some cells to be erased very quickly, causing other transistor cells to be forced in a depletion mode, and leaving still other cells non-erased. It is therefore important that the threshold levels of each erased cell be carefully controlled so that each cell operates at substantially the same program and erase voltage. Any enhancement or undercutting of the implant window would have a deleterious effect on those thresholds.

Not only is it important to closely monitor the etch process to ensure the etch is optimally complete (that no residue remains), but it is also important that the etch procedures used in the self-aligned sources throughout the flash EPROM array be simultaneously applied to redundancy select areas adjacent the array. Many flash EPROM devices incorporate a redundancy column or row arranged adjacent the array. A redundancy select transistor can be used to programmably select a redundant or spare row (or column) in lieu of a defective row (or column) within the array. The redundant row or column is advantageously used after the monolithic circuit is formed in order to salvage what would normally be a defective monolithic circuit. Redundancy is a well known concept in memory devices, and must be taken into account when forming a flash EPROM with self-aligned source regions. The redundancy select transistor may also have self-aligned source regions, and it is preferred that self-aligned sources of the redundancy select areas be etched and implanted during the same process steps in which the self-aligned sources of the core array are etched and implanted, respectively. If the core array and redundancy source areas are etched and implanted in separate steps, two separate masks are required to achieve the stated result. Added masking steps and lithography procedures adds to the complexity and cost of the resulting circuit. It would therefore be advantageous to combine the redundancy select area masking with the core area masking in order to reduce the overall costs of the resulting circuit. Combining the masking steps with self-aligned source etch and diffusion in both the redundancy select area and core area would provide yet a further advantage.

SUMMARY OF THE INVENTION

The problems outlined above are in large part solved by the improved flash EPROM manufacturing process of the present invention. That is, the manufacturing process hereof comprises a redundancy select area and a core area arranged upon a single monolithic circuit, wherein both areas include a self-aligned source region. The self-aligned source region in both areas is advantageously etched using a single masking step. Thereafter, the etched source regions in both areas can be simultaneously implanted to achieve the advantages of ETOX technology with fine-line self-aligned source. Moreover, any residue or incompletely etched material remaining in the source regions can be selectively removed with a convenient removal step using existing wet etch process flow prior to impurity implant. Thus, plasma etch can be optimally stopped prior to isotropic over-etching in order to prevent or substantially eliminate enlargement of the window implant area and erase-programming threshold skews associated therewith. By carefully controlling the etch and implant with the self-aligned source regions, drive-in diffusions of the implanted atoms allows for more careful control of the amount of out-diffusion and resulting program/erase threshold skews of an ETOX device.

Broadly speaking, the present invention contemplates a method for producing a monolithic integrated circuit comprising a flash EPROM device. In particular, the flash EPROM device includes a programmable core area and a programmable redundancy select area. Etch and implant within source regions of the core area and redundancy select area are accomplished by a series of steps. A field oxide is selectively formed upon a semiconductor substrate having an oxide opening within the redundancy select area and a pair of substantially parallel field oxide strips within the core area. Next, polysilicon is patterned within the oxide opening and upon the substrate to form a control polysilicon strip within the redundancy select area. Likewise, a pair of substantially parallel polysilicon word strips are patterned within the core area. The polysilicon word strips are formed substantially perpendicular to the field oxide strips. A photoresist is then placed upon the upper topography of the semiconductor substrate, and select regions of the photoresist are removed using a single mask. The resulting photoresist is patterned having windows overlying (i) a portion of the oxide opening on one side of the control polysilicon strip and (ii) a region between the pair of polysilicon word strips. Next, the field oxide strips are plasma etched in a region beneath the photoresist window within the core area and native oxide is also simultaneously etched beneath the photoresist window within the redundancy select area. Accordingly, a single mask is used to form the photoresist which causes self-aligned source regions to be etched of field oxide and native oxides therein. Thereafter, residue resulting from the plasma etching step is substantially removed from the substrate directly beneath the photoresist windows. After the residue is removed, the substrate is substantially free of any non-etched oxide or any polymer residue in order to allow the next step of direct implantation of impurities through the photoresist windows and into the bare silicon substrate. The self-aligned source regions are thereby formed within the redundancy select area and core area resulting in first and second source regions, respectively.

The redundancy select area comprises a substrate area embodying an electrically programmable transistor having the control polysilicon strip placed within an active area, and the first source region is configured on one side of the control polysilicon strip according to normal MOS fabrication technology. Thereafter, another implant step can be used to heavily dope both source and drain regions on both sides of the control polysilicon strip necessary for transistor activation.

The core area comprises a substrate area embodying an array of electrically programmable transistors arranged in the plurality of rows and columns. Each of the programmable transistors have a self-aligned source region which is an elongated contiguous region extending between a pair of parallel polysilicon word strips. Adjacent rows of programmable transistors can thereby share the contiguous source region in order to provide a high density configuration. Beneath select regions of each control polysilicon strip are numerous floating gate polysilicon regions. Each floating gate polysilicon extends between and substantially perpendicular to adjacent pairs of field oxide strips.

A row of the core array of electrically programmable transistors is controlled by an electrical signal sent from a row decoder through one of the pair of polysilicon word strips. A common bit line output from a column of the array of electrically programmable transistors is sent to a column decoder. The common bit line output from a column of the array is connected to the first source region of the electrically programmable transistor within the redundancy select area.

BRIEF DESCRIPTION OF THE DRAWINGS

Other objects and advantages of the invention will become apparent upon reading the following detailed description and upon reference to accompanying drawings in which:

FIG. 1 is a schematic diagram of a portion of a flash EPROM with redundancy selection according to the present invention;

FIG. 2 is a top view of a redundancy select area formed according to the present invention;

FIG. 3 is a top plan view of a portion of the EEPROM core memory area formed according to the present invention;

Figure 4:
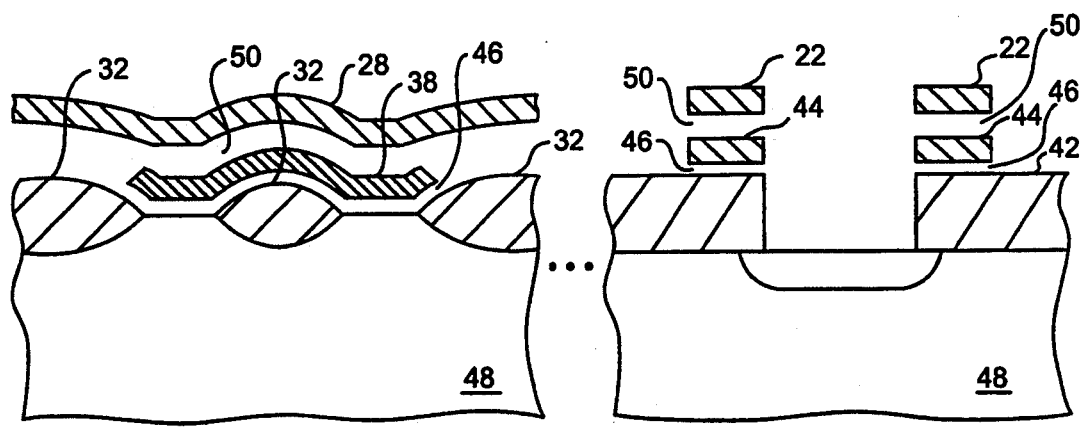
FIG. 4 is a cross-sectional view along plane A—A of FIGS. 2 and 3.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a partial view of a flash EPROM device 10 is shown. EPROM device 10 is shown having a core array 12 of electrically programmable transistors 14. Array 12 includes a plurality of rows and columns of transistors 14. The source of each transistor is connected to ground, while the drain of each transistor is connected to a bit line 16. Bit line 16 is connected to a column decode circuit 18 via a redundancy select transistor placed within a redundancy select area 20. Each transistor 14 also includes a control gate and a floating gate, the floating gate is shown in dashed line. The control gate of each transistor is connected to a word lines 22 connected to row decode circuit 24.

By altering the charge stored on the floating gate, the threshold voltage required to be applied to the control gate of transistor 14 is changed to either a voltage level representing a logical 1 or a voltage level representing a logical 0. When the single transistor memory cell is accessed for reading, a carefully controlled voltage amount is applied to the control gate which will activate select transistors which are unprogrammed (floating gate uncharged with a relatively low control gate threshold voltage). Other "programmed" transistors will not turn on thereby allowing access to the programmed data stored within array 12. During erasure, all transistors 14 are erased simultaneously such that they become unprogrammed. This is accomplished by applying select voltages to the word lines and common source lines connected to the control gates and sources of each transistor, respectively. Details of the architecture needed to program (write) access (read) and/or bulk-erase transistors 14 within array 12 is well known and, furthermore, an exemplary architecture is described in U.S. Pat. No. 4,999,812 to Amin (herein incorporated by reference).

During the fabrication of array 12, one or more cells may be improperly formed—either by mis-alignment or processing skews. The resulting defective cell will be inoperable and will not properly read, write or erase. Instead of discarding the entire monolithic circuit embodying array 12, one or more defective cells can be substituted by a spare column or row of cells. Redundancy is therefore necessary to minimize manufacturing costs with little or no perceived inconvenience to the operator. In the example shown in FIG. 1, transistors within redundancy select area 20 operate to disconnect a defective column from the column decode circuit 18 and substitute a spare or redundant column to the array. A redundant column 26 of transistors 14 is shown in FIG. 1, each transistor having a drain connected to a corresponding bit line 16 and to a redundancy select area 20. Connection between bit line 16 and column decode circuit 18 is controlled by a single control polysilicon line 28.

Referring now to FIG. 2, redundancy select area 20 is shown in top view having an active region 30 surrounded by a field oxide 32 (shown with cross hatching). Active area 30 accommodates two transistors with a common source and common floating gate. Both transistors are controlled by control polysilicon strip 28. A first transistor, having drain 34 and shared-source 36 is used to electrically program a floating gate 38 residing a spaced distance between active region 30 and overlying polysilicon 28. Floating gate 38 can be programmed according to well known EPROM programming techniques to either allow connection or disconnection between drain 40 and common source 36. Upon reading a controlled voltage at control line 28, a conduction path will either be present or not present between drain 40 and source 36 thereby either linking or severing connection between column decode circuit 18 and bit line 16. Bit line 16 is preferably connected to common source 36, whereas column decode circuit 18 is connected to drain 40. Program drain 34 of each select transistor within area 20 is controlled by a separate signal connected thereto. The signal either activates or deactivates the conduction path in order to indicate operable or defective, respectively, cell or cells within the corresponding column.

Turning now to FIG. 3, a top plan view of a portion of core array 12 is shown. In particular, a pair of word lines 22, formed in polysilicon strips, are shown placed orthogonally over a pair of field oxide strips 42. Field oxide strips 42 separate active regions of adjacent transistors 14 and can be etched away between substantially parallel pairs of polysilicon strips 22 according to the well known self-aligned process. The resulting area between polysilicon can thereby be formed in a contiguous region as a source, and the source region can provide ground voltage to adjacent transistors formed along polysilicon strips 22. A floating gate 44 is formed between field oxide strips 42, wherein gate 44 is in alignment with polysilicon lines 22. Floating gate 44 overlaps several tenths of a micron into the region directly above field oxide strips 42 for reasons stated herein below. It is appreciated from FIGS. 2 and 3 that floating gate and overlying control gate regions are directly in line with one another to form an ETOX-type flash EPROM transistor, and that the ends of etched field oxides 42 terminate at the edge of control lines 22 according to the improved self-aligned source fabrication process, herein defined.

Turning now to FIG. 4, a cross-sectional view is shown of FIGS. 2 and 3 along plane A—A. A thin tunnel oxide 46 is placed between floating gate 38 and substrate 48. Tunnel oxide 46 consists of thermally grown silicon dioxide at a thickness of approximately 100 Å. Another dielectric layer 50 is interposed between floating gate 38 and control gate 28. Dielectric 50 can include an oxide (silicon dioxide) as well as nitride to form an oxide-nitride-oxide layering between floating gate 38 and control gate 28. The bottom layer of oxide is generally 120 Å in thickness, the nitride is approximately 190 Å, and the overlying oxide is generally 40 Å in thickness. The oxide-nitride-oxide (ONO) composition provides good data retention characteristics and maintains a more even threshold voltage amongst the array of transistors. Each transistor having ONO composition is less likely to become over-erased, i.e., become a depletion-mode device, as is often found in non-ONO devices. The nitride layer (not shown) is therefore sandwiched between two thin layers of oxide. The nitride layer is generally formed using low pressure chemical vapor deposition (LPCVD) techniques, whereas the bottom oxide is grown by a low-temperature dry oxidation, and the upper oxide can be formed with high-temperature wet oxidation.

By maintaining tunnel oxide 46 of uniform thickness between the entirety of floating gate 38 (as well as floating gate 44) and substrate 48 (and field oxide 42) the resulting EPROM device is of ETOX technology, and thereby much more simple to operate than floating gate, textured poly or MNOS technologies.

Figure 5:
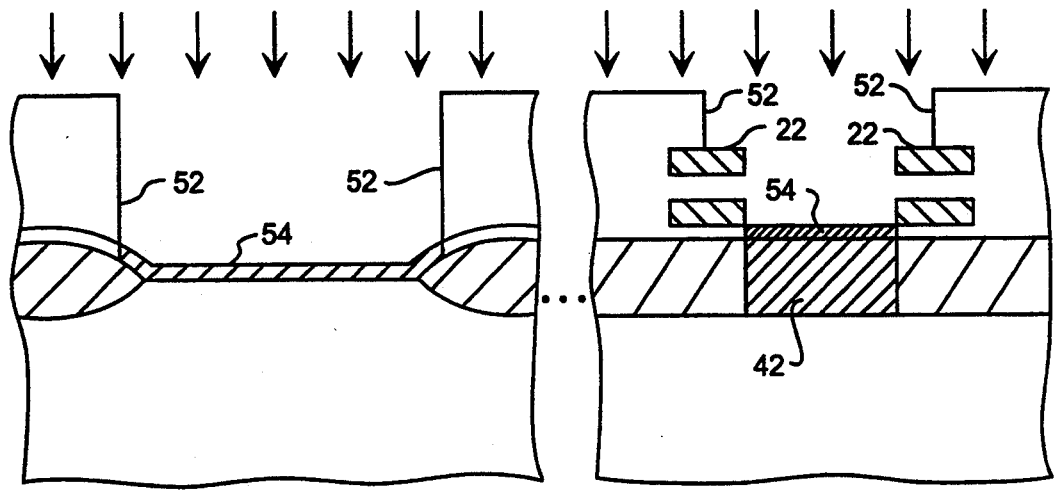
FIG. 5 is a cross-sectional view along plane B—B of FIGS. 2 and 3 during one step of the fabrication process according to the present invention.

Referring now to FIG. 5, a process step shown along plane B—B of FIGS. 2 and 3 is shown. The process step shown is only one step in many steps necessary to form a resulting flash EPROM device. In particular, the process step shown is that which occurs after select field oxides 32 and 42 are grown, after floating gate regions 38 and 44 are formed, after interlevel dielectric 50 (including ONO formation) is deposited, and after control gates 22 and 28 are formed. Once the substrate topography is presented having redundancy select areas 20 and core areas 12 formed therein, a single mask is used to pattern photoresist 52 in all areas across the substrate. Patterned photoresist 52 allows plasma etching through the patterned photoresist windows of underlying exposed silicon dioxide. Plasma etching, using either reactive or non-reactive agents, is used to selectively remove silicon dioxide but not interact with resist 52 or polysilicon of exposed control gate 22. For satisfactory etching, several kinds of reactions may be desirable, and to that end there may be a multiplexity of input gases to the plasma. The plasma products may etch the target material as well as surrounding material, and some of the by-products or residue may deposit on the etching surface and either slow or stop the etching rate. It is contemplated that in order to etch the underlying silicon dioxide of native oxide 54 and field oxide 42, feed gases such as $CF_4$, $CHF_3$, $C_2F_6$ and $C_3F_8$ may be used. Using $CF_4$ feed gas as an example, the following reaction occurs at the surface of the silicon dioxide:

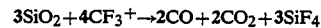

Unfortunately, there are many machine variables which affect the plasma etch rate of a conventional RF plasma/RIE etcher. Some of those variables include: operating pressure, wafer temperature, electrode voltage, inlet gas composition, gas flow rate, and loading (i.e., area of etchable surface divided by area of electrode). The etch rate will generally depend upon the flux of active species (free radicals and chemically active reactive ions) which impinge upon the exposed surface. The etch process described herein is designed to minimize residue or polymer 56 formation while maintaining selectivity. It is by design, therefore, that an enhanced chamber pressure of approximately 700 mTorr is used to increase the etch rate, with selectivity maintained by using 700 watt of RF power at a 1.0 cm gap between etch electrodes. Furthermore, $CHF_3$ to passed over the wafer at the flow rate of 27 sccm. Additionally, $CF_4$ is flowed at 13 sccm, and argon (Ar) is flowed at 200 sccm. The etch process is maintained for approximately 57 seconds at a temperature of approximately $-5°$ C. with the DC bias voltage of the etcher set at a floating voltage. A suitable etcher set according to the standards shown above is a LAM Research model no. RAINBOW 4500 etcher. and thereby improve the throughput of the processed wafer.

Selectivity is often defined as the ratio of the etch rate of the layer being deliberately removed by etching to that of the layer exposed to the etch but not to be intentionally removed. Plasma etching is generally less selective than counterpart wet etching processes. As such, it is important to constantly monitor the plasma etching process to ensure that surrounding materials which are not to be etched remain unetched. It is well known that etchant materials having carbon, hydrogen and/or chlorine elements etch thermally grown silicon dioxide at a rate of approximately 15 times that of surrounding silicon, or approximately 5 times that of surrounding polysilicon. As such, even if plasma etching is carefully monitored, a small amount of surrounding silicon (silicon from control or floating gate polysilicon, or silicon from the substrate) is removed. As such, polysilicon strips may be lessened in width thereby changing the operation of transistors 14. Moreover, the photoresist may also be etched at a fairly rapid rate to expose more upper surfaces of polysilicon strips 22, as shown in FIG. 5, causing a possible thinning effect upon the exposed polysilicon. Even though plasma etch is carefully monitored using interferometers and ellipsometers, residue which impinges and settles upon the layer being etched can skew the interferometer and ellipsometer readings. Moreover, mass spectrometers which measure the exit gas stream cannot easily determine rapid changes in removed by-product which is desirable from that which is undesirable. It is therefore necessary to look toward other means for controlling the plasma etch process. For example, since silicon dioxide etching and photoresist removal produce substantial amounts of carbon monoxide, the CO emission band for each substance may be confused by the operator, thereby rendering mass spectromity useless.

Accordingly, it is a desirable aspect of the present invention to provide cessation of plasma etch step shown in FIG. 5 at a properly timed moment just prior to removal of areas which are not to be etched. Thus, when operating at 700 mTorr, wafer temperature of $-5°$ C., etcher electrode voltage set at a floating value with electrode gap set at approximately 1.0 cm, inlet gas composition/flow rate of 27 sccm of $CHF_3$, 13 sccm $CF_4$, 200 sccm Ar, and using a plasma etcher manufactured by LAM Research Corp., model no. "Rainbow 4500", the etch duration can be timed and limited at approximately 57 seconds.

Figure 6:
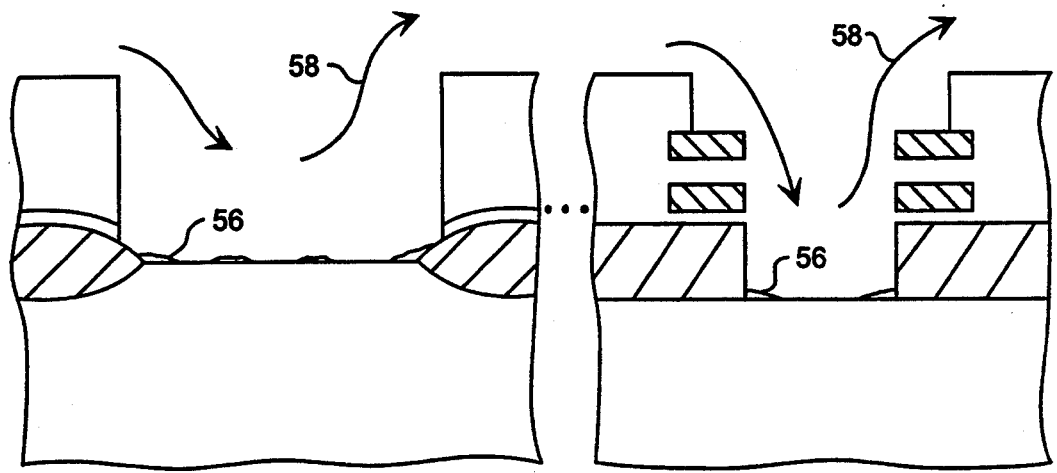
FIG. 6 is a cross-sectional view along plane B—B of FIGS. 2 and 3 during a subsequent step of the fabrication process according to the present invention.

After plasma etch has ceased, small amounts of silicon dioxide or residue 56 may remain in the area being etched. Silicon dioxide or residue 56 can then be subjected to a wet etch or chemical bath of higher selectivity than the previous plasma etch. Using a standard etch-rinse cycle of a standard etch/water formulation, residue 56 is selectively removed along the wet etch flow pattern 58, shown in FIG. 6. Preferably, when two separate masks are used for etch and implant, there are two etch-rinse cycles: the first cycle is used to remove organic residual compounds while the second cycle can remove inorganic compounds. In dilute water, ammonium hydroxide can be used to remove organic compounds followed by a water rinse. Thereafter, hydrogen chloride can be used followed by another water rinse to remove inorganic compounds. Stirring or ultrasonic agitation may also be used, if needed, to enhance the etching effect. Ammonium hydroxide and hydrogen chloride are suitably chosen to selectively etch resist and/or silicon dioxide residue (polymers) from the silicon substrate surface while maintaining the substrate surface virtually intact. With the single mask process, however, all polymers formed by plasma etch are water soluble, and the ammonium hydroxide and hydrogen chloride cleaning solutions are not and cannot be used. The plasma etch for single mask must produce only water soluble polymers, and this is the case set forth herein.

Figure 7:
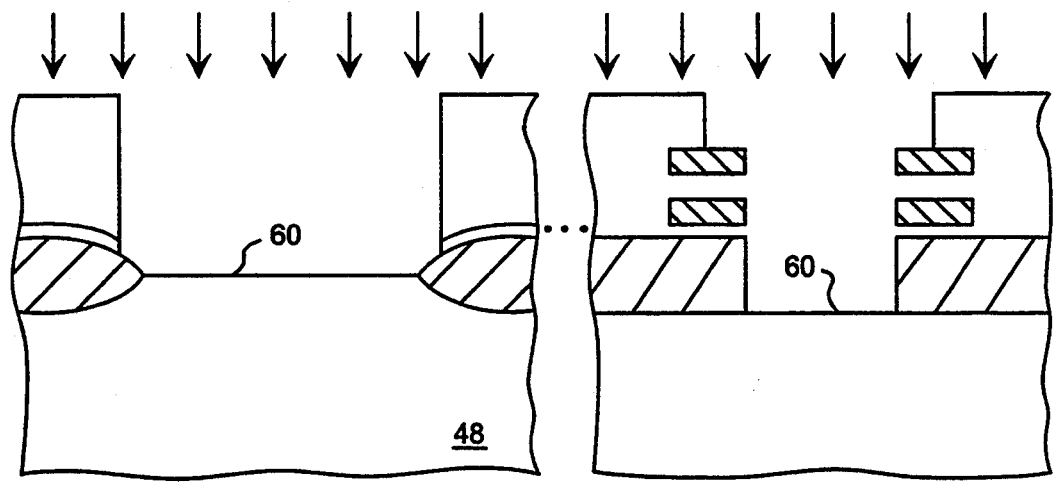
FIG. 7 is a cross-sectional view along plane B—B of FIGS. 2 and 3 during a further subsequent step of the fabrication process according to the present invention.
Figure 8:
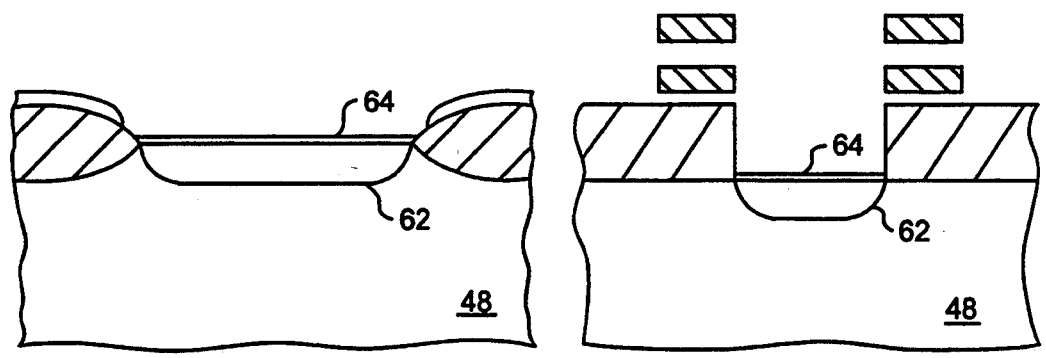
FIG. 8 is a cross-sectional view along plane B—B of FIGS. 2 and 3 during a still further subsequent step of the fabrication process according to the present invention.

After both plasma etch and wet etch (chemical rinse) are completed, a substantially clean, bare silicon surface is presented for implantation as shown in FIG. 7. Silicon surface 60 of substrate 48 is directly implanted with impurities absent a pre-oxidized layer placed on the substrate. Direct implantation must be carefully performed due to the absence of the pre-oxidized layer so as to prevent lattice damage within the crystalline silicon. Notably, low implant dosages are required in order to prevent such damage. In particular, implant dosages must not exceed $2.5 \times 10^{14}$ atoms/$cm^2$ of phosphorus ($P^{31}$). Additionally, implant energies must not exceed 60 keV. It is appreciated that the light doping concentration of phosphorus within the etched self-aligned source region is used to improve junction breakdown of subsequently implanted, heavily doped, source area. The phosphorus implant through the self-aligned regions appears at a concentration peak density within substrate 48 of approximately 0.1 micron, as shown in FIG. 8. Phosphorus atoms implanted within the substrate form a double diffusion implant region 62. Source and drain regions are subsequently implanted, wherein source region is implanted in the same area as double diffusion implant 62 to form higher conductivity arsenic ($As^{75}$). Arsenic atoms render the source region more conductive than that achieved by phosphorus double diffusion implant 62. Arsenic implant is not shown for sake of brevity, however, it is understood that heavy source and drain implants are to follow the steps described herein as would be well known to the skilled artisan in MOS processing.

Figure 9:
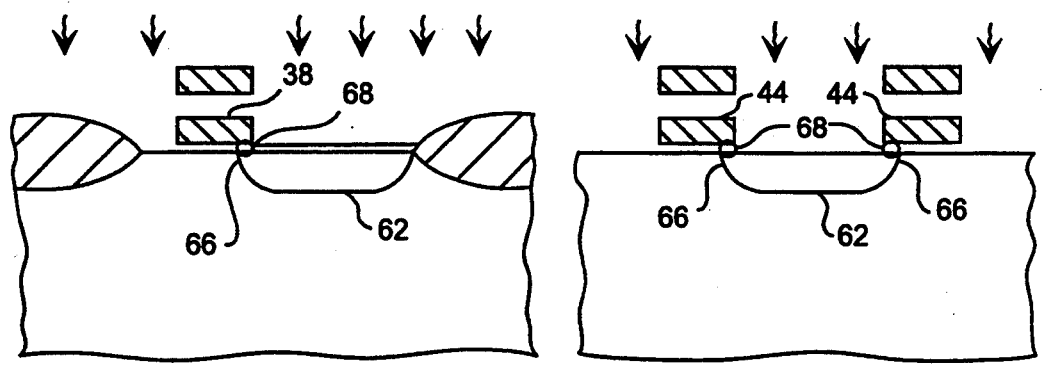
FIG. 9 is a cross-sectional view along plane C—C of FIGS. 2 and 3 during yet another subsequent step of the fabrication process according to the present invention.

After double diffusion implant 62 is placed, a relatively thin native oxide 64 forms upon substrate 48. Native oxide 64 prevents additional impurities from being deposited onto or implanted into substrate 48 after the implant step is complete. After native oxides are grown, FIG. 9 illustrates a cross-sectional view along plane C—C of FIGS. 2 and 3. Substrate 48 is subjected to a thermal cycle of approximately 1000° C. to drive the double diffusion implant 62 in a lateral direction parallel to the upper surface of substrate 48. Specifically, double diffusion implant 62 diffuses into a substrate and laterally outward such that edge 66 of implant region 62 extends beneath floating gate 38 and floating gates 44. Drive-in step of FIG. 9 is necessary for presenting a tunnel region 68 underneath each programmable floating gate. Tunnel region 68 allows electron tunneling between floating gate 44 and source region 62 according to the well recognized Fowler-Nordheim tunneling mechanism. By carefully controlling the location and geometry of the edge of field oxide strip 42 and providing under-etch material or residue is removed from the source/substrate area, the above steps ensure that edge 66 is controllably placed at a specified distance outside of the inside edge of floating gate 44. Moreover, careful control of the edge location is achieved for each transistor in the array of transistors within core area 12 as well as the select transistor within redundancy select area 20.

It is well known and generally recognized that there are numerous steps prior to and after the steps shown in FIGS. 5–9. To complete the ETOX double poly flash EPROM device, it is necessary to implant source and drain regions, place an interlevel dielectric between the control gate and a subsequent metal layer, deposit contact windows for the metallization, and passivate the upper topography according to well known MOS processing techniques. In order not to unnecessarily obscure the present invention, well-known processing steps which proceed or are subsequent to those taught in FIGS. 5–9 are not described in detail, however, it will be obvious to one skilled in the art that such specific steps would be employed to provide a flash EPROM device hereof.

It will be appreciated to those skilled in the art having the benefit of this disclosure that this invention is believed to be capable of applications with any flash EPROM memory device with redundancy using ETOX technology and having self-aligned source regions. Furthermore, it is also to be understood that the form of invention shown and described is to be taken as a presently preferred embodiment. Various modifications and changes may be made to each and every processing step as would be obvious to a person skilled in the art without departing from the spirit and scope of the invention as set forth in the claims. It is intended that the following claims be interpreted to embrace all such modifications and changes and, accordingly, the specifications and drawings are to be regarded in an illustrative rather than a restrictive sense.

What is claimed is:

1. A method for etching and implanting source regions within a programmable core area and a programmable redundancy select area comprising the steps of:
   providing a semiconductor substrate having a redundancy select area and a core area;
   selectively growing field oxide upon said substrate to form an oxide opening within said redundancy select area and a pair of substantially parallel field oxide strips within said core area;
   patterning polysilicon within said oxide opening and upon said substrate to form a control polysilicon strip within said redundancy select area and a pair of substantially parallel polysilicon word strips within said core area, said polysilicon word strips being substantially perpendicular to said field oxide strips;
   placing photoresist upon the upper topography of said semiconductor substrate;
   selectively removing said photoresist using a single mask to form photoresist windows overlying (i) a portion of said oxide opening on one side of said control polysilicon strip and (ii) a region between said pair of polysilicon word strips;
   plasma etching said field oxide strips beneath said photoresist window within said core area and simultaneously etching a native oxide formed beneath said photoresist window within said redundancy select area;
   substantially removing residue resulting from said plasma etching step from said substrate directly beneath said photoresist windows; and
   implanting impurities through said photoresist windows and directly into said substrate to form first and second source regions in said redundancy select area and said core area, respectively.

2. The method as recited in claim 1, wherein said redundancy select area comprises an electrically programmable transistor having said first source region.

3. The method as recited in claim 1, wherein said core area comprises an array of electrically programmable transistors arranged in a plurality of rows and columns, each said programmable transistor having said second source region.

4. The method as recited in claim 3, wherein a row of said array of electrically programmable transistors is controlled by an electrical signal sent from a row decoder through one line of one pair of said pairs of polysilicon word strips.

5. The method as recited in claim 3, wherein a common bit line output from a column of said array of electrically programmable transistors is sent to a column decoder.

6. The method as recited in claim 3, wherein a common bit line output from a column of said array of electrically programmable transistors is connected to said first source region of an electrically programmable transistor within said redundancy select area.

7. The method as recited in claim 1, wherein said selectively growing step comprises selectively removing a silicon nitride layer and thereafter growing an oxide to a thickness in areas void of the silicon nitride.

8. The method as recited in claim 1, wherein said selectively removing residue step comprises wet etching said residue from said semiconductor substrate.

9. The method as recited in claim 1, wherein said selectively removing residue step does not substantially remove the masking photoresist.

10. The method as recited in claim 1, further comprising heating said semiconductor substrate after said implanting step to drive said impurities in a lateral direction within said substrate to a point spaced below said polysilicon word strips.

11. The method as recited in claim 1, further comprising further implanting impurities into said redundancy select areas through said oxide opening and into said core area to form source and drain dopant regions on respective opposite sides of said control polysilicon strip and on respective opposite sides of said polysilicon word strips.

12. A method for etching and implanting source regions within a flash EPROM core area and a redundancy area comprising the steps of:
   providing a semiconductor substrate having a redundancy select area and a core area;
   providing a column decode circuit and a row decode circuit upon said substrate and proximate to said core area;
   providing a column of redundant electrically programmable transistors upon said substrate and proximate to said core area;
   selectively growing field oxide upon said substrate to form an oxide opening within said redundancy select area and a pair of substantially parallel field oxide strips within said core area;
   patterning polysilicon within said oxide opening and upon said substrate to form a control polysilicon strip within said redundancy select area and a pair of substantially parallel polysilicon word strips within said core area, said control polysilicon strip being adapted for receiving electrical signals from said row decode circuit and for programmably connecting said column of redundant electrically programmable transistors to said column decode circuit;
   patterning photoresist upon said substrate to simultaneously form photoresist windows overlying (i) a portion of said oxide opening on one side of said control polysilicon strip and (ii) a region between said pair of polysilicon word strips;
   plasma etching said field oxide strips between said photoresist window within said core area and simultaneously etching a native oxide formed beneath said photoresist window within said redundancy select area;

substantially removing residue resulting from said plasma etching step from said substrate directly beneath said photoresist windows; and implanting impurities through said photoresist windows and directly into said substrate to form first and second source regions in said redundancy select area and said core area, respectively.

13. The method as recited in claim 12, wherein said redundancy select area comprises an electrically programmable transistor having said second source region on one side of said transistor.

14. The method as recited in claim 12, wherein said core area comprises an array of electrically programmable transistors arranged in a plurality of rows and columns, each said programmable transistor within a row of transistors having said second source region arranged on one side of one of said pair of polysilicon word strips.

15. The method as recited in claim 14, wherein a common bit line output from a column of said array of electrically programmable transistors is sent to said column decoder.

16. The method as recited in claim 15, wherein said common bit line output is connected to said first source region of an electrically programmable transistor, whereby said electrical signals programmably connect said common bit line output to said column decode circuit.

17. The method as recited in claim 12, wherein said substantially removing residue step comprises wet etching said residue from said semiconductor substrate.

18. The method as recited in claim 12, wherein said substantially removing residue step does not substantially remove the photoresist.

19. The method as recited in claim 12, further comprising heating said semiconductor substrate after said implanting step to drive said impurities within said substrate substantially parallel to the upper surface of said substrate to a point spaced below said polysilicon word strips.

20. The method as recited in claim 12, further comprising further implanting impurities into said redundancy select areas through said oxide opening and into said core area to form source and drain dopant regions on respective opposite sides of said control polysilicon strip and on respective opposites sides of each of said polysilicon word strips.

21. The method as recited in claim 12, wherein said selectively growing step comprises selectively removing a silicon nitride layer and thereafter growing an oxide to a thickness in areas void of the silicon nitride.

* * * * *